(12) United States Patent
He et al.

(10) Patent No.: US 10,984,725 B1
(45) Date of Patent: Apr. 20, 2021

(54) DISPLAY PANEL, METHOD FOR MANUFACTURING THE SAME, AND DISPLAY DEVICE

(71) Applicant: Xiamen Tianma Micro-Electronics Co., Ltd, Xiamen (CN)

(72) Inventors: Shui He, Xiamen (CN); Kenji Sera, Xiamen (CN); Shuxian Yang, Xiamen (CN); Ming Yang, Shanghai (CN)

(73) Assignee: Xiamen Tianma Micro-Electronics Co., Ltd, Xiamen (CN)

( * ) Notice: Subject to any disclaimer, the term of this patent is extended or adjusted under 35 U.S.C. 154(b) by 0 days.

(21) Appl. No.: 16/732,084

(22) Filed: Dec. 31, 2019

(30) Foreign Application Priority Data

Oct. 31, 2019 (CN) .......................... 201911054266.3

(51) Int. Cl.
*G09G 3/3266* (2016.01)
*H01L 27/32* (2006.01)
(Continued)

(52) U.S. Cl.
CPC ......... *G09G 3/3266* (2013.01); *G09G 3/3275* (2013.01); *H01L 27/3248* (2013.01);
(Continued)

(58) Field of Classification Search
CPC ................ G09G 3/3266; G09G 3/3275; H01L 27/3248; H01L 27/3262; H01L 27/3265; H01L 27/3276
(Continued)

(56) References Cited

U.S. PATENT DOCUMENTS 10,504,984 B2 * 12/2019 Gu .................... H01L 29/42384
2009/0014799 A1 * 1/2009 Isobe .................. H01L 27/1203
257/351
(Continued)

FOREIGN PATENT DOCUMENTS

CN 209045568 U 6/2019
CN 2029045568 * 6/2019 ............ H01L 27/115

OTHER PUBLICATIONS

Chinese First Office Action, dated Jul. 22, 2020, issued in corresponding Chinese Application No. 201911054266.3, filed Oct. 31, 2019, 21 pages.

*Primary Examiner* — Prabodh M Dharia
(74) *Attorney, Agent, or Firm* — Christensen O'Connor Johnson Kindness PLLC

(57) ABSTRACT

A display panel includes a substrate and a plurality of pixel driving circuits disposed on the substrate, and the plurality of pixel driving circuits include a storage capacitor and transistors. The transistors include transistors of a first type and a second type. The transistor of the first type is a composite transistor and includes a first sub-transistor and a second sub-transistor that are connected in series. The first sub-transistor is a low-temperature polysilicon transistor, and the second sub-transistor is an oxide transistor. The transistor of the first type includes a composite active layer, a composite gate electrode, a composite source electrode, and a composite drain electrode. The composite source electrode or the composite drain electrode of the transistor of the first type is electrically connected to the storage capacitor, or the transistor of the first type is in an off state during a light-emitting phase.

18 Claims, 12 Drawing Sheets

(51) Int. Cl.
*G09G 3/3275* (2016.01)
*H01L 27/12* (2006.01)
*H01L 29/786* (2006.01)
*H01L 29/66* (2006.01)

(52) U.S. Cl.
CPC ...... *H01L 27/3262* (2013.01); *H01L 27/3265* (2013.01); *H01L 27/3276* (2013.01); *H01L 27/124* (2013.01); *H01L 27/1222* (2013.01); *H01L 27/1225* (2013.01); *H01L 27/1251* (2013.01); *H01L 27/1255* (2013.01); *H01L 27/1259* (2013.01); *H01L 29/66757* (2013.01); *H01L 29/66969* (2013.01); *H01L 29/7869* (2013.01); *H01L 29/78675* (2013.01); *H01L 2227/323* (2013.01)

(58) Field of Classification Search
USPC .............................. 345/82, 214; 257/43, 351
See application file for complete search history.

(56) References Cited

U.S. PATENT DOCUMENTS

| | | | | |
|---|---|---|---|---|
| 2010/0238095 | A1* | 9/2010 | Zhang | H01L 27/0266 |
| | | | | 345/82 |
| 2010/0276682 | A1* | 11/2010 | Yeh | H01L 29/7869 |
| | | | | 257/43 |
| 2016/0013212 | A1* | 1/2016 | Im | H01L 27/1251 |
| | | | | 257/43 |
| 2017/0140724 | A1* | 5/2017 | Lin | G02F 1/136213 |
| 2017/0357113 | A1* | 12/2017 | Yamazaki | G02F 1/13471 |
| 2019/0081270 | A1* | 3/2019 | Kim | H01L 51/5044 |
| 2020/0212073 | A1* | 7/2020 | Yamazaki | H01L 29/7869 |

\* cited by examiner

DISPLAY PANEL, METHOD FOR MANUFACTURING THE SAME, AND DISPLAY DEVICE

CROSS-REFERENCE TO RELATED APPLICATIONS

The present disclosure claims priority to Chinese Patent Application No. 201911054266.3, filed on Oct. 31, 2019, the content of which is incorporated herein by reference in its entirety.

TECHNICAL FIELD

The present disclosure relates to the field of display technologies, and in particular, to a display panel, a method for manufacturing the display panel, and a display device.

BACKGROUND

A display panel includes a pixel driving circuit and an organic light-emitting element that are electrically connected to each other. The pixel driving circuit provides a driving current to the organic light-emitting element to drive the organic light-emitting element to emit light. The pixel driving circuit includes a storage capacitor and a plurality of transistors. However, based on an arrangement of transistors in the pixel driving circuit in the related art, a node voltage in the pixel driving circuit is unstable and an operation state of the pixel driving circuit is unstable. As a result, the driving current provided to the organic light-emitting element deviates from its standard value, thereby affecting a display performance.

SUMMARY

In view of this, embodiments of the present disclosure provide a display panel, a method for manufacturing the display panel, and a display device, which can improve stability of a voltage at a node of the pixel driving circuit and stability of an operation state.

In an aspect, an embodiment of the present disclosure provides a display panel, including: a substrate; a plurality of pixel driving circuits disposed on the substrate, the plurality of pixel driving circuits including a storage capacitor and transistors. In an embodiment, the transistors include at least one transistor of a first type and at least one transistor of a second type. In an embodiment, each of the at least one transistor of the first type is a composite transistor and includes a first sub-transistor and a second sub-transistor that are connected in series. In an embodiment, the first sub-transistor is a low-temperature polysilicon transistor, and the second sub-transistor is an oxide transistor. In an embodiment, each of the at least one transistor of the first type includes a composite active layer, a composite gate electrode, a composite source electrode, and a composite drain electrode. In an embodiment, the composite source electrode or the composite drain electrode of each of the at least one transistor of the first type is electrically connected to the storage capacitor, or each of the at least one transistor of the first type is in an off state during a light-emitting phase.

In another aspect, an embodiment of the present disclosure provides a method for manufacturing a display panel, including: providing a substrate; and forming a pixel driving circuit on the substrate, the pixel driving circuit including a storage capacitor and transistors. In an embodiment, the transistors include at least one transistor of a first type and at least one transistor of a second type. In an embodiment, each of the at least one transistor of the first type is a composite transistor and includes a first sub-transistor and a second sub-transistor that are connected in series. In an embodiment, the first sub-transistor is a low-temperature polysilicon transistor, and the second sub-transistor is an oxide transistor. In an embodiment, each of the at least one transistor of the first type includes a composite active layer, a composite gate electrode, a composite source electrode, and a composite drain electrode. In an embodiment, the composite source electrode or the composite drain electrode of each of the at least one transistor of the first type is electrically connected to the storage capacitor, or each of the at least one transistor of the first type is in an off state during a light-emitting phase.

In still another aspect, an embodiment of the present disclosure provides a display device including the display panel described above.

BRIEF DESCRIPTION OF DRAWINGS

In order to more clearly illustrate technical solutions in embodiments of the present disclosure, the accompanying drawings used in the embodiments are briefly introduced as follows. It should be noted that the drawings describe as follows are merely part of the embodiments of the present disclosure, other drawings can also be acquired by those skilled in the art without paying creative efforts.

DESCRIPTION OF EMBODIMENTS

Figure 1:
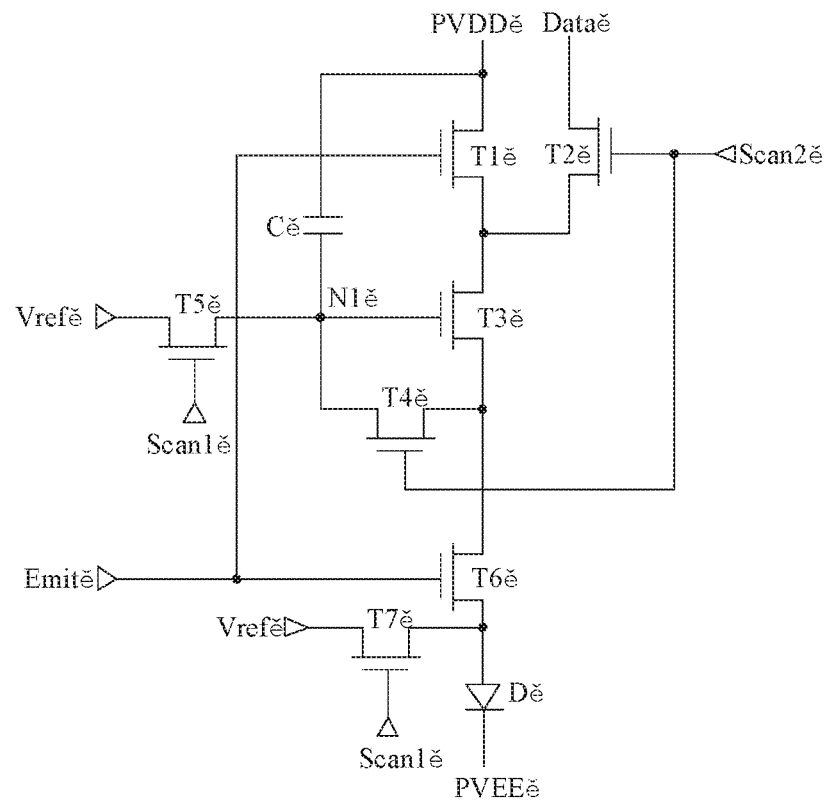
FIG. 1 is a schematic diagram of a structure of a pixel driving circuit in the related art.

For better illustrating technical solutions of the present disclosure, embodiments of the present disclosure will be described in detail as follows with reference to the accompanying drawings.

It should be noted that, the described embodiments are merely exemplary embodiments of the present disclosure, which shall not be interpreted as providing limitations to the present disclosure. All other embodiments obtained by those skilled in the art without creative efforts according to the embodiments of the present disclosure are within the scope of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be understood that the term "and/or" used herein is merely an association relationship describing associated objects, indicating that there may be three relationships, for example, A and/or B may indicate that three cases, i.e., A existing individually, A and B existing simultaneously, B existing individually. In addition, the character "/" herein generally indicates that the related objects before and after the character form an "or" relationship.

It should be understood that although the transistor may be described using the terms of "first", "second", "third", etc., in the embodiments of the present disclosure, the transistor will not be limited to these terms. These terms are merely used to distinguish transistors from one another. For example, without departing from the scope of the embodiments of the present disclosure, a transistor of a first type may also be referred to as a transistor of a second type, and similarly, a transistor of a second type may also be referred to as a transistor of a first type.

In order to better illustrate the technical solution provided by the embodiments of the present disclosure, an operation principle of a pixel driving circuit will first be described by taking the structure of the pixel driving circuit in the related art shown in FIG. 1 as an example and combining the sequence diagram shown in FIG. 2.

One driving cycle of the pixel driving circuit includes an initialization phase t1', a charging phase t2', and a light-emitting phase t3'.

During the initialization phase t1', a first scan line Scan1' provides a high level, a second scan line Scan2' and a light-emitting control signal line Emit' each provide a low level, and a fifth transistor T5' and a seventh transistor T7' are turned-on under a high level. Herein, the "level" refers to a magnitude of a voltage. A reference voltage line Vref provides a reference voltage signal $V_{ref}'$ that flows into a gate electrode of a third transistor T3' and an anode of an organic light-emitting element D' through the turned-on fifth transistor T5' and seventh transistor T7', so as to reset a voltage at the gate electrode of the third transistor T3' and a voltage at the anode of the organic light-emitting element D'. At this time, a potential of a first node N1 is $V_{N1}'=V_{ref}'$.

During the charging phase t2', the first scan line Scan1' and the light-emitting control signal line Emit' each provide a low level, the second scan line Scan2' provides a high level, and a second transistor T2' and a fourth transistor T4' are turned on under a high level. A data line Data provides a data signal $V_{Data}$ that is written into the first node N1' through the turned-on second transistor T2', third transistor T3', and fourth transistor T4'. At this time, $V_{N1}'=V_{Data}'-|Vth'|$, where Vth' represents a threshold voltage of the third transistor T3'.

During the light-emitting phase t3', the first scan line Scan1' and the second scan line Scan2' each provide a low level, the light-emitting control signal line Emit' provides a high level, and a first transistor T1' and a sixth transistor T6' are continuously turned on under a high level. A power signal line PVDD' provides a power signal VPVDD' that flows into the organic light-emitting element D' through the turned-on first transistor T1', third transistor T3', and sixth transistor T6'. The light-emitting element D' emits light under an action of the power signal $V_{PVDD}'$ and $V_{N1}'$. At this time, a driving current flowing into the organic light-emitting element D' is $$I' = \frac{1}{2}\mu_n C_{ox} \frac{W}{L}(V_{PVDD}' - V_{N1}' - |V_{th}'|)^2,$$

that is, $$I' = \frac{1}{2}\mu_n C_{ox} \frac{W}{L}(V_{PVDD}' - V_{Data}')^2,$$

where $\mu_n$ represents a migration rate of electrons, $C_{ox}$ represents a capacitance of a gate oxide layer per unit area, and W/L represents a channel width-to-length ratio of the third transistor T3'.

It can be understood that, in the pixel driving circuit, the storage capacitor C' is used to store the potential of the first node N1' so as to maintain it at a normal potential, thereby achieving normal operation of the pixel driving circuit. Through a study, the inventor found that among multiple transistors included in the pixel driving circuit, when a source electrode or a drain electrode of a transistor is electrically connected to the storage capacitor C', if the transistor has a large leakage current in an off state or has a poor stability, the transistor will affect a potential of an electrode plate of the storage capacitor electrically connected thereto, causing the potential stored in the storage capacitor to change, which in turn will affect the potential of the first node N1'. Especially during the light-emitting phase t3', if the potential of the first node N1' changes, the driving current I' flowing into the organic light-emitting element D' also changes, which results in an actual light-emitting brightness of the organic light-emitting element D' that deviates from its standard light-emitting brightness, thereby affecting normal display.

Figure 3:
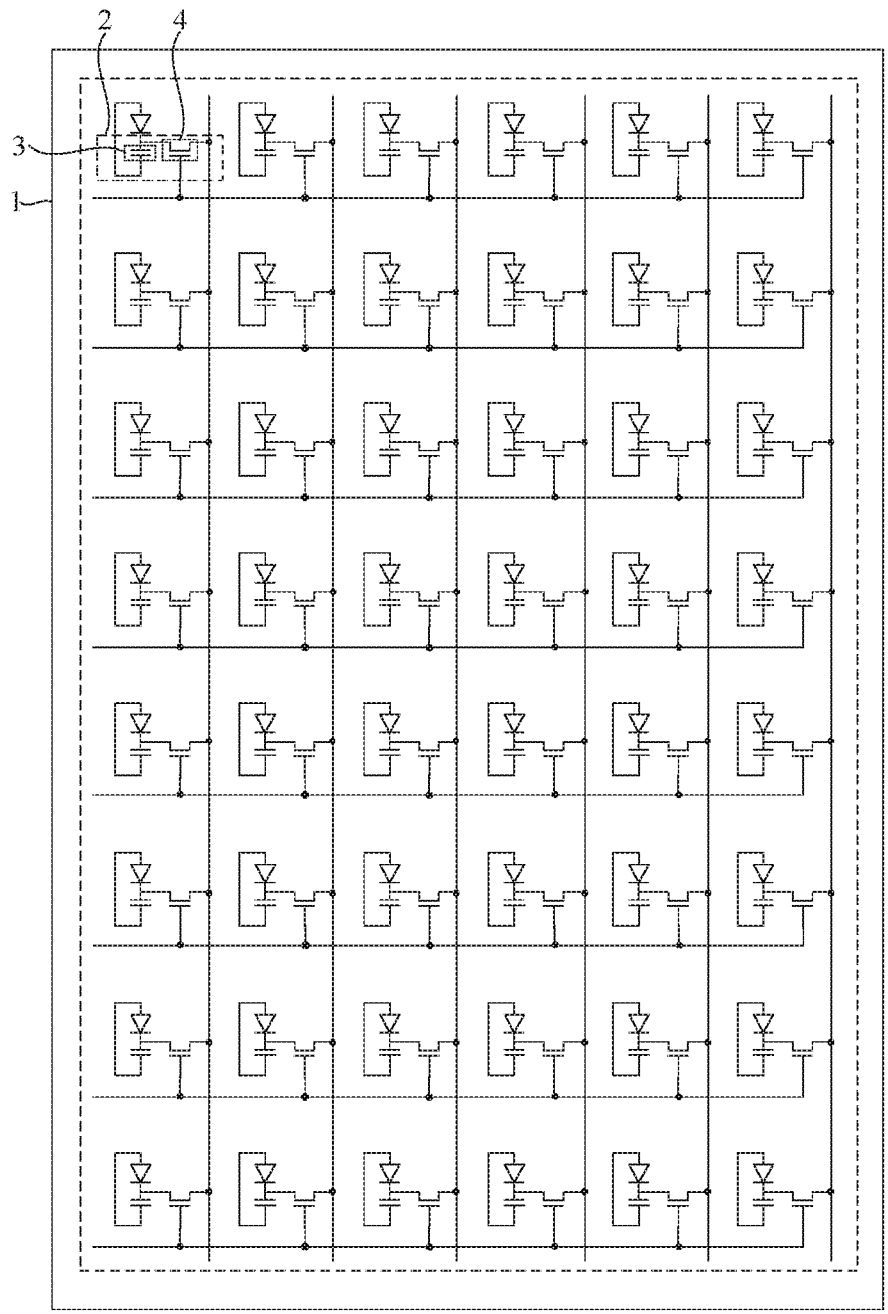
FIG. 3 is a schematic diagram of a structure of a display panel according to an embodiment of the present disclosure.
Figure 4:
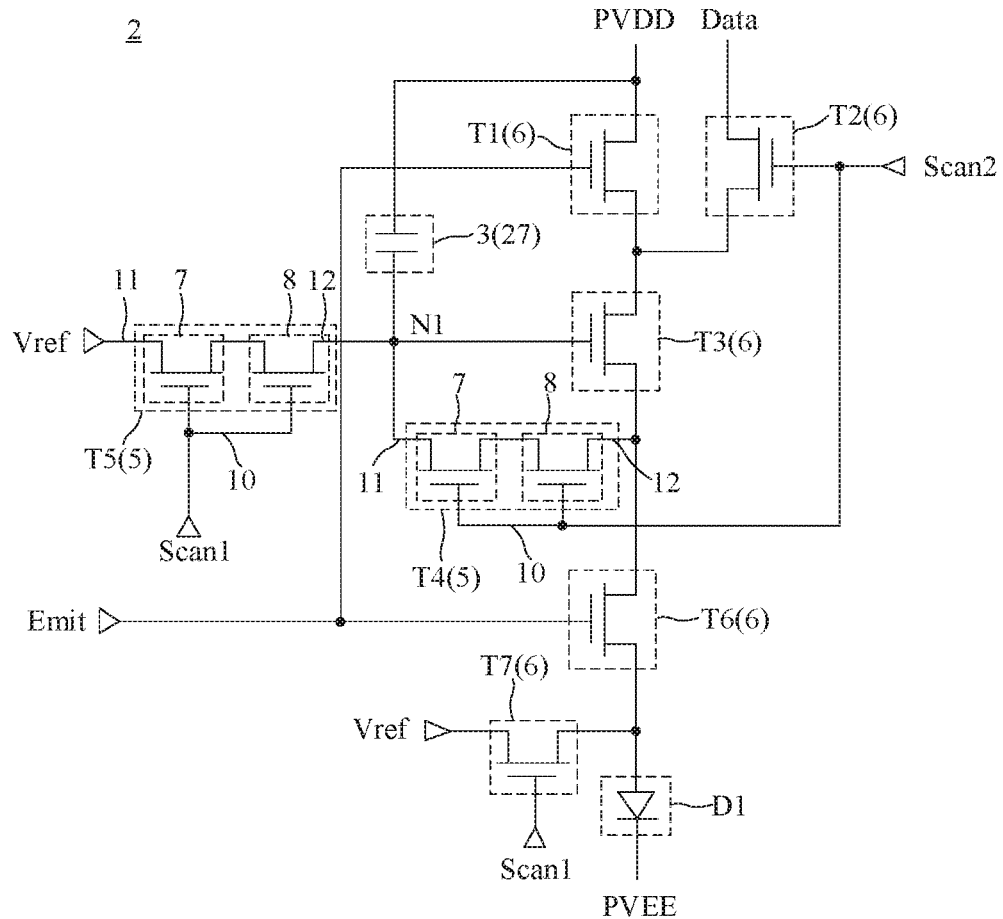
FIG. 4 is a schematic diagram of a structure of a pixel driving circuit according to an embodiment of the present disclosure.
Figure 5:
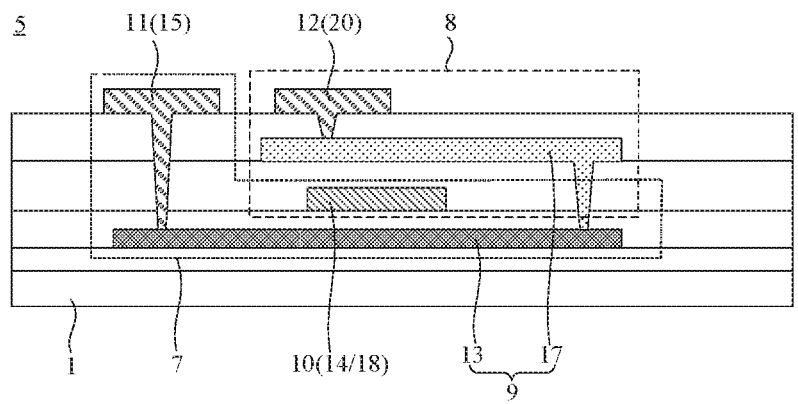
FIG. 5 is a schematic diagram of a layer structure of a transistor of a first type according to an embodiment of the present disclosure.

An embodiment of the present disclosure provides a display panel. FIG. 3 is a schematic diagram of a structure of a display panel according to an embodiment of the present disclosure, FIG. 4 is a schematic diagram of a structure of a pixel driving circuit according to an embodiment of the present disclosure, and FIG. 5 is a schematic diagram of a layer structure of a transistor of a first type according to an embodiment of the present disclosure. As shown in FIG. 3 to FIG. 5, the display panel includes a substrate 1 and a plurality of pixel driving circuits 2 disposed on the substrate 1. The pixel driving circuit 2 includes a storage capacitor 3 and a transistor 4. The transistors 4 include a transistor 5 of a first type and a transistor 6 of a second type. The transistor 5 of the first type is a composite transistor, and the transistor 5 of the first type includes a first sub-transistor 7 and a second sub-transistor 8 connected in series. The first sub-transistor 7 is a low-temperature polysilicon transistor, and the second sub-transistor 8 is an oxide transistor. The transistor 5 of the first type includes a composite active layer 9, a composite gate electrode 10, a composite source electrode 11 and a composite drain electrode 12. The composite source electrode 11 or the composite drain electrode 12 of the transistor 5 of the first type is electrically connected to the storage capacitor 3, or the transistor 5 of the first type is in an off state during the light-emitting phase.

Figure 6:
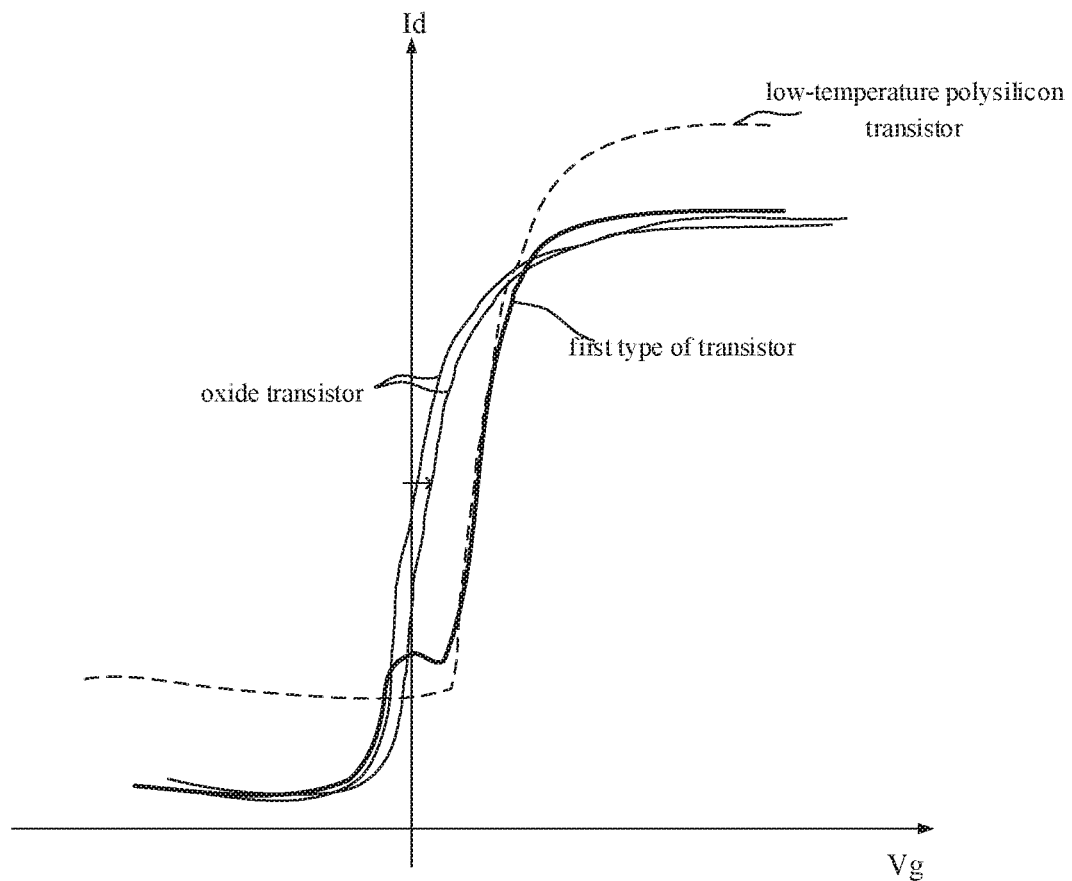
FIG. 6 is a Vg-Id characteristic curve diagram of a transistor of a first type according to an embodiment of the present disclosure.

In the display panel provided by this embodiment of the present disclosure, the transistor 5 of the first type includes a low-temperature polysilicon transistor and an oxide transistor connected in series. When the composite source electrode 11 or the composite drain electrode 12 of the transistor 5 of the first type is electrically connected to the storage capacitor 3, or the transistor 5 of the first type is in an off state during the light-emitting phase, based on a characteristic of a small leakage current of the oxide transistor in an off state, a leakage current of the transistor 5 of the first type formed by the oxide transistor and the low-temperature polysilicon transistor being connected in series is also small. In this way, an influence of the leakage current of the transistor 5 of the first type on the potential of the electrode plate of the storage capacitor 3 electrically connected thereto can be alleviated, thereby improving the stability of the potential of the node. Meanwhile, based on a characteristic of good stability of the low-temperature polysilicon transistor, the transistor 5 of the first type can also have good stability. Even if the transistor 5 of the first type is in a negative bias state for long time, its characteristics will not change significantly, thereby avoiding threshold voltage drift and the like problems. FIG. 6 is a Vg-Id characteristic curve diagram of a transistor of a first type according to an embodiment of the present disclosure. With reference to FIG. 6, it can be seen that for a single type of oxide transistor, when a voltage Vg at the gate electrode is negative and the oxide transistor is in an off state, the leakage current Id is small, but after a voltage has been applied to a gate electrode of the oxide transistor for long time, a Vg-Id characteristic curve corresponding to the oxide transistor will shift, indicating that the stability of the oxide transistor is poor. For a single type of low-temperature polysilicon transistor, after a voltage has been applied to a gate electrode of the low-temperature polysilicon transistor for long time, a Vg-Id characteristic curve corresponding to the low-temperature polysilicon transistor does not change, indicating that the stability of the low-temperature polysilicon transistor is good, but when a voltage Vg at the gate electrode is negative and the low-temperature polysilicon transistor is in an off state, the leakage current Id is large. For the transistor 5 of the first type formed by an oxide transistor and a low-temperature polysilicon transistor being connected in series, when a voltage Vg at the gate electrode is negative and the transistor 5 of the first type is in an off state, the leakage current Id is small. Meanwhile, even after a voltage has been applied to the gate electrode of the transistor 5 of the first type for long time, a Vg-Id characteristic curve corresponding to the transistor 5 of the first type will not change, indicating that the stability of the transistor 5 of the first type is good. It can be seen that a composite structure based on the transistor 5 of the first type can allow the transistor 5 of the first type to have characteristics of a small leakage current and good stability in an off state. This can alleviate an influence of the leakage current on the potential stored in the storage capacitor 3, thereby improving the stability of the voltage at the node in the pixel driving circuit 2. In this way, an accuracy of an actual light-emitting brightness of the light-emitting diode can be improved, and the operation stability itself can be improved, thereby improving the stability of the overall pixel driving circuit 2' in an operation state.

It should be noted that when the transistor 5 of the first type is a composite transistor, if the oxide transistor and the low-temperature polysilicon transistor are connected in parallel, although the transistor formed by connection in parallel has good stability, the leakage current in an off state is large due to an influence of the low-temperature polysilicon transistor, which is not conducive to stability of the potential of the anode. In this embodiment of the present disclosure, by the oxide transistor and the low-temperature polysilicon transistor being connected in series, based on characteristics of transistors connected in series, the leakage current of the transistors connected in series in an off state is determined by one of the oxide transistor and the low-temperature polysilicon transistor that has a smaller leakage current in an off state. Therefore, the transistor 5 of the first type formed by connection in series not only has good stability, but also has a characteristic of a small leakage current in an off state, thereby further improving a performance of the transistor 5 of the first type.

In addition, it should be noted that the oxide transistor may also be defined as an oxide semiconductor, and may include an indium gallium zinc oxide transistor or a zinc oxide transistor.

With further reference to FIG. 5, the first sub-transistor 7 includes a first active layer 13, a first gate electrode 14, and a first source electrode 15. The first source electrode 15 is electrically connected to the first active layer 13. The second sub-transistor 8 includes a second active layer 17, a second gate electrode 18, and a second drain electrode 20. The second drain electrode 20 is electrically connected to the second active layer 17. The first active layer 13 is electrically connected to the second active layer 17. The composite active layer 9 includes the first active layer 13 and the second active layer 17, a composite source electrode 11 is the first source electrode 15, and a composite drain electrode 12 is the second drain electrode 20. Based on the structure described above, by the first active layer 13 being electrically connected to the second active layer 17, the first sub-transistor 7 and the second sub-transistor 8 can be connected in series, thereby forming the transistor 5 of the first type.

It should be noted that, generally, a transistor includes an active layer, a gate electrode, a source electrode, and a drain electrode. For the first sub-transistor 7 and the second sub-transistor 8, an end of the first active layer 13 that is in contact with the second active layer 17 can be regarded as the drain electrode of the first sub-transistor 7, an end of the second active layer 17 that is in contact with the first active layer 13 can be regarded as the source electrode of the second sub-transistor 8, and there is no need to additionally provide a layer for forming the drain electrode of the first sub-transistor 7 and the source electrode of the second sub-transistor 8.

Further, with further reference to FIG. 5, the second active layer 17 is located on a side of the first active layer 13 facing away from the substrate 1, and the second active layer 17 overlaps the first active layer 13 in a direction perpendicular to a plane of the substrate 1. When the first sub-transistor 7 and the second sub-transistor 8 are connected in series, the first active layer 13 overlapping the second active layer 17 in the direction perpendicular to the plane of the substrate 1 can reduce a space occupied by the first active layer 13 and the second active layer 17 in a direction parallel to the plane of the substrate 1, that is to reduce a space occupied by the first sub-transistor. In this way, a space occupied by a single pixel driving circuit 2 can be reduced, thereby increasing the number of pixel driving circuits 2 provided in a unit area, and thus increasing a resolution of the display panel.

Further, with further reference to FIG. 5, the first gate electrode 14 is reused as the second gate electrode 18, and the composite gate electrode 10 is the first gate electrode 14. In this way, in a single transistor 5 of the first type, only one gate electrode may be provided as the composite gate electrode 10. This not only simplifies a manufacturing process, but also reduces a space occupied by the composite gate electrode 10.

Figure 7:
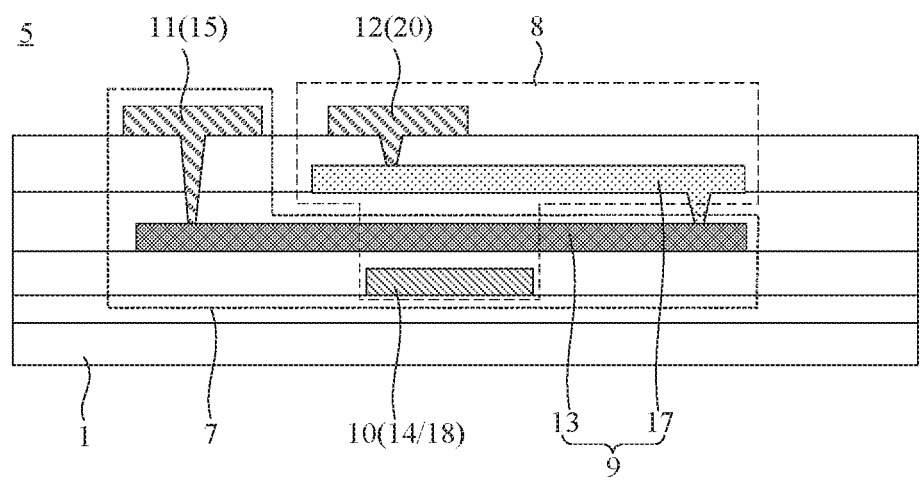
FIG. 7 is a schematic diagram of another layer structure of a transistor of a first type according to an embodiment of the present disclosure.

FIG. 7 is a schematic diagram of another layer structure of a transistor of a first type according to an embodiment of the present disclosure. With further reference to FIG. 7, the first gate electrode 14 is located on a side of the first active layer 13 facing towards the substrate 1. In this case, an insulation layer between the first active layer 13 and the second active layer 17 has a small thickness, which can reduce a processing complexity. Moreover, when the first active layer 13 is electrically connected to the second active layer 17 via a through hole in the insulation layer, connection stability between the two can be improved.

Figure 8:
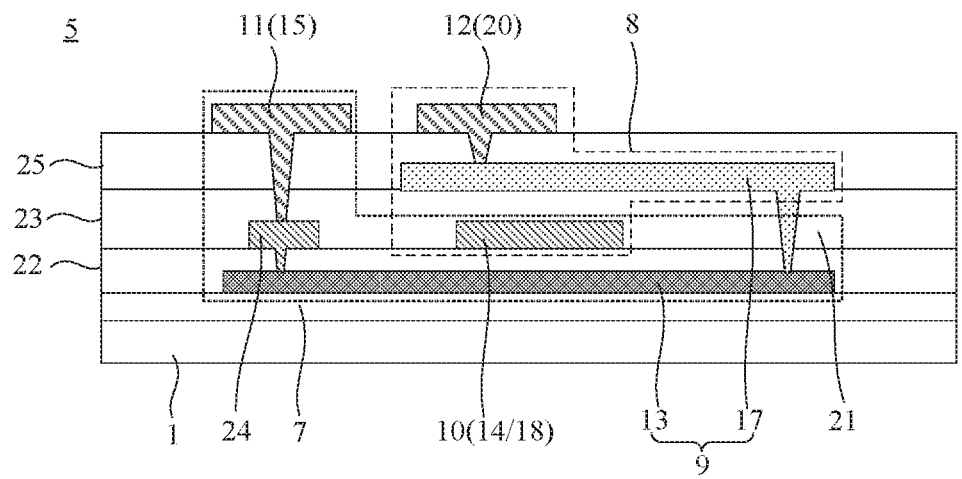
FIG. 8 is a schematic diagram of still another layer structure of a transistor of a first type according to an embodiment of the present disclosure.

FIG. 8 is a schematic diagram of still another layer structure of a transistor of a first type according to an embodiment of the present disclosure. With further reference to FIG. 8, the first gate electrode 14 is located between the first active layer 13 and the second active layer 17, and the first source electrode 15 is located on a side of the second active layer 17 facing away from the substrate 1. The first source electrode 15 is electrically connected to the first active layer 13 through an auxiliary connection portion 24, and the auxiliary connection portion 24 and the first gate electrode 14 are arranged in a same layer.

Based on the structure described above, a process flow of forming the first active layer 13, the first gate electrode 14, the auxiliary connection portion 24, the second active layer 17, and the first source electrode 15 includes: forming the first active layer 13 on the substrate 1; forming the first insulation layer 22 on a side of the first active layer 13 facing away from the substrate 1, forming a through hole in the first insulation layer 22 in such a manner that a source-drain contact area of the first active layer 13 is exposed by the through hole, and performing a hydrofluoric acid treatment on the source-drain contact area; forming the first gate electrode 14 and the auxiliary connection portion 24 on a side of the first insulation layer 22 facing away from the substrate 1 in such a manner that the auxiliary connection portion 24 is electrically connected to the source-drain contact area of the first active layer 13 via the through hole in the first insulation layer 22; forming a second insulation layer 23 on a side of the first gate electrode 14 facing away from substrate 1, and forming a through hole in the second insulation layer 23; forming a second active layer 17 on a side of the second insulation layer 23 facing away from the substrate 1 in such a manner that the second active layer 17 is electrically connected to the first active layer 13 via the through holes in the second insulation layer 23 and the first insulation layer 22; forming a third insulation layer 25 on a side of the second active layer 17 facing away from the substrate 1, and forming a through hole in the third insulation layer 25 to expose a portion of the auxiliary connection portion 24; and forming the first source electrode 15 on a side of the third insulation layer 25 facing away from the substrate 1 in such a manner that the first source electrode 15 is electrically connected to the auxiliary connection portion 24 via the through hole in the third insulation layer 25, so as to achieve an electrical connection with the source-drain contact area of the first active layer 13. If a second connection portion is not provided and the first source electrode 15 is directly connected to the first active layer 13, then after the through hole in the third insulation layer 25 is formed, a hydrofluoric acid treatment needs to be applied on the source-drain contact area of the first active layer 13. Since the second active layer 17 has been formed at this time, the hydrofluoric acid will penetrate into the layer and cause corrosion of the second active layer 17. When the auxiliary connection portion 24 is provided, after the through hole in the first insulation layer 22 is formed, a hydrofluoric acid treatment can be performed on the source-drain contact area of the first active layer 13. Since the second active layer 17 has not been formed at this time, the hydrofluoric acid will not cause corrosion of the second active layer 17, thereby improving the stability of the second active layer 17. In addition, the auxiliary connection portion 24 and the first gate electrode 14 are arranged in a same layer. The auxiliary connection portion 24 does not need to occupy additional layer space, which not only simplifies the process flow, but also facilitates thin and light design of the display panel.

Figure 9:
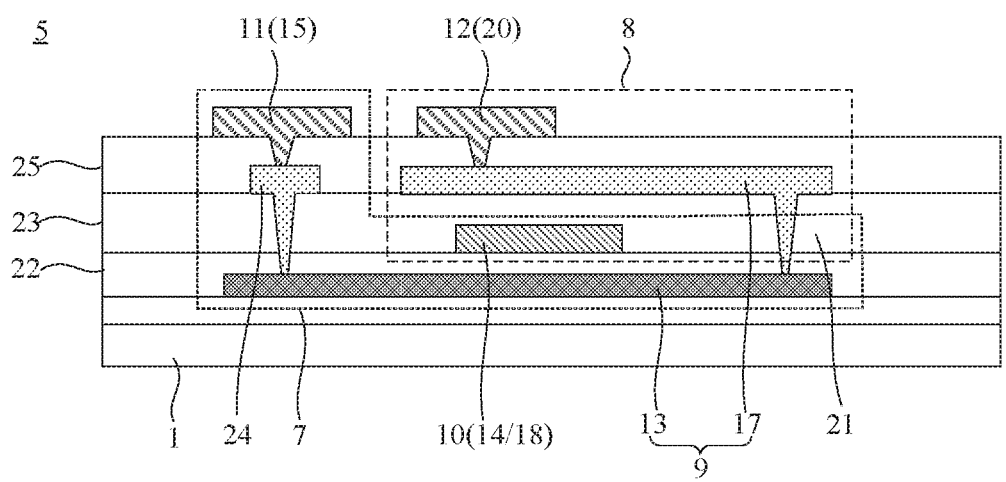
FIG. 9 is a schematic diagram of another layer structure of a transistor of a first type according to an embodiment of the present disclosure.

FIG. 9 is a schematic diagram of another layer structure of a transistor of a first type according to an embodiment of the present disclosure. With reference to FIG. 9, the auxiliary connection portion 24 and the second active layer 17 are arranged in a common layer. Likewise, the auxiliary connection portion 24 and the first gate electrode 14 are arranged in a same layer, by arranging the auxiliary connection portion 24 and the second active layer 17 in the common layer, the process of hydrofluoric acid treatment is performed after the through holes in the first insulation layer 22 and the second insulation layer 23 are formed and before the second active layer 17 is formed. In this way, corrosion of the second active layer 17 by the hydrofluoric acid is prevented or limited. Moreover, the auxiliary connection portion 24 and the second active layer 17 are arranged in the same layer, so that the auxiliary connection portion 24 does not need to occupy additional layer space. This not only simplifies the process flow, but also facilitates thin and light design of the display panel.

Figure 10:
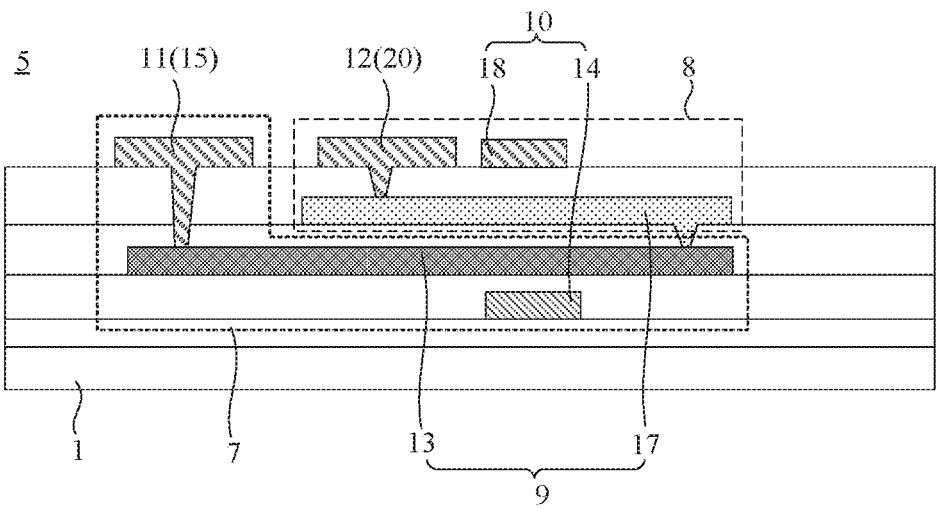
FIG. 10 is a schematic diagram of yet another layer structure of a transistor of a first type according to an embodiment of the present disclosure.

FIG. 10 is a schematic diagram of yet another layer structure of a transistor of a first type according to an embodiment of the present disclosure. With reference to FIG. 10, the composite gate electrode 10 includes a first gate electrode 14 and a second gate electrode 18. The first gate electrode 14 is electrically connected to the second gate electrode 18, and the first gate electrode 14 is located on a side of the first active layer 13 facing towards the substrate 1. The second gate electrode 18, the composite source electrode 11 and the composite drain electrode 12 are arranged in a common layer. When the composite gate electrode 10 includes the first gate electrode 14 and the second gate electrode 18, the first gate electrode 14 is located on the side of the first active layer 13 facing towards the substrate 1. In this case, a thickness of the insulation layer between the first active layer 13 and the second active layer 17 is reduced. This improves a connection stability between the first active layer 13 and the second active layer 17 as well as reducing a distance between the first active layer 13 and the first source electrode 11. When the first source electrode 11 is electrically connected to the first active layer 13 via the through hole, a depth of the through hole can be reduced, thereby reducing a length of a metal trace in the through hole, and thus reducing a resistance thereof. In addition, the second gate electrode 18, the composite source electrode 11 and the composite drain electrode 12 are arranged in the same layer, so that the second gate electrode 18 does not need to occupy additional layer space, and thus will not cause an increase in the thickness of the display panel.

Figure 11:
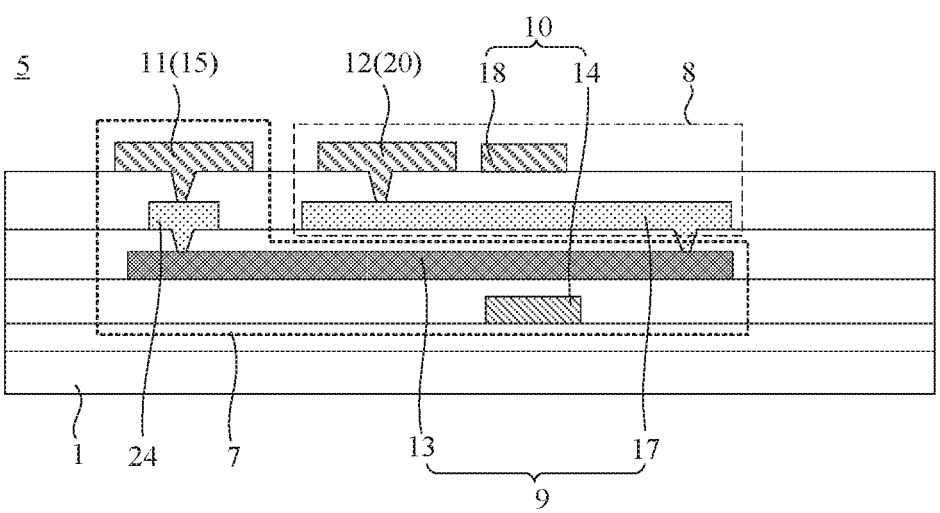
FIG. 11 is a schematic diagram of still another layer structure of a transistor of a first type according to an embodiment of the present disclosure.

FIG. 11 is a schematic diagram of still another layer structure of a transistor of a first type according to an embodiment of the present disclosure. With reference to FIG. 11, in order to further reduce the depth of the through hole via which the first source electrode 11 is electrically connected to the first active layer 13, the first source electrode 15 is electrically connected to the first active layer 13 through the auxiliary connection portion 24, and the auxiliary connection portion 24 and the second active layer 17 are arranged in a same layer.

Figure 12:
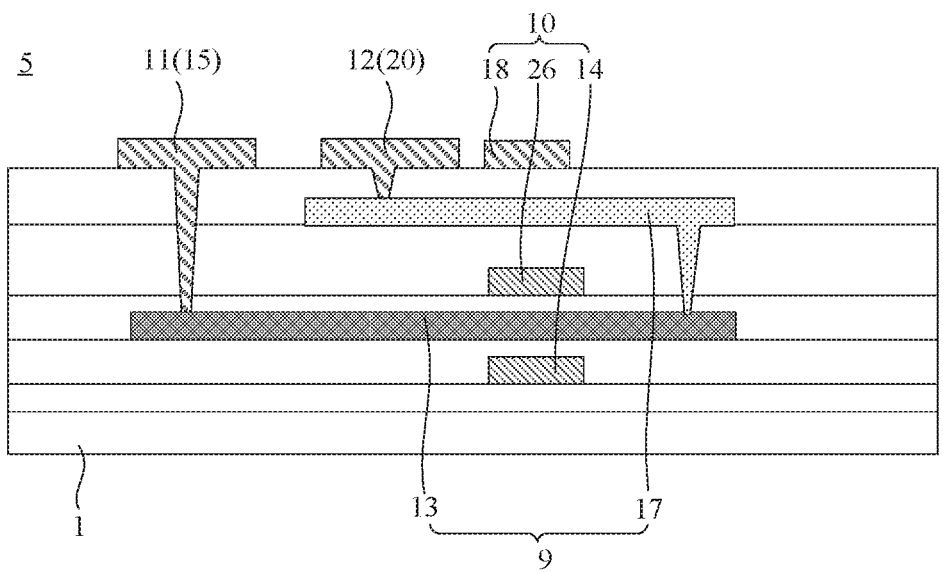
FIG. 12 is a schematic diagram of another layer structure of a transistor of a first type according to an embodiment of the present disclosure.

FIG. 12 is a schematic diagram of another layer structure of a transistor of a first type according to an embodiment of the present disclosure. Further, with reference to FIG. 12, the composite gate electrode 10 further includes a third gate electrode 26 that is located between the first active layer 13 and the second active layer 17. The third gate electrode 26 is respectively electrically connected to the first gate electrode 14 and the second gate electrode 18. After the third gate electrode 26 is provided, if any one of the first gate electrode 14, the second gate electrode 18, and the third gate electrode 26 is damaged, the other two gate electrodes can still achieve normal operation of the transistor 5 of the first type, thereby improving the operation reliability of the transistor 5 of the first type.

Further, with further reference to FIG. 10, in a direction perpendicular to the plane of substrate 1, the first gate electrode 14 overlaps the second gate electrode 18, thereby reducing a space occupied by the first gate electrode 14 and the second gate electrode 18 in a direction parallel with the plane of substrate 1. This can reduce an amount of space occupied by the transistor 5 of the first type and the pixel driving circuit 2 caused by the composite gate electrode 10.

For example, in order to further improve the operation stability of the pixel driving circuit 2, the transistor 6 of the second type may be set to be a low-temperature polysilicon transistor with better stability.

With further reference to FIG. 4, the pixel driving circuit 2 includes: a first storage capacitor 27 including a first electrode plate electrically connected to a power signal line PVDD, and a second electrode plate; a first transistor T1 including a gate electrode electrically connected to a light-emitting control signal line Emit, a source electrode electrically connected to the power signal line PVDD, and a drain electrode; a second transistor T2 including a gate electrode electrically connected to a second scan signal line Scan2, a source electrode electrically connected to a data line Data, and a drain electrode electrically connected to the drain electrode of the first transistor T1; a third transistor T3 including a gate electrode electrically connected to the second electrode plate of the first storage capacitor 27, a source electrode electrically connected to the drain electrode of the second transistor T2, and a drain electrode; a fourth transistor T4 being the transistor 5 of the first type and including a composite gate electrode 10 electrically connected to the second scan signal line Scan2, a composite source electrode 11 electrically connected to the second electrode plate of the first storage capacitor 27, and a composite drain electrode 12 electrically connected to the drain electrode of the third transistor T3; a fifth transistor T5 being the transistor 5 of the first type and including a composite gate electrode 10 electrically connected to a first scan signal line Scan1, a composite source electrode 11 electrically connected to a reference signal line Vref, and a composite drain electrode 12 electrically connected to the second electrode plate of the first storage capacitor 27; a sixth transistor T6 including a gate electrode electrically connected to the light-emitting control signal line Emit, a source electrode electrically connected to the composite drain electrode 12 of the fourth transistor T4, and a drain electrode electrically connected to an anode of a first organic light-emitting element D1; and a seventh transistor T7 including a gate electrode electrically connected to the first scan signal line Scan1, a source electrode electrically connected to the reference signal line Vref, and a drain electrode electrically connected to the anode of the first organic light-emitting element D1.

Figure 2:
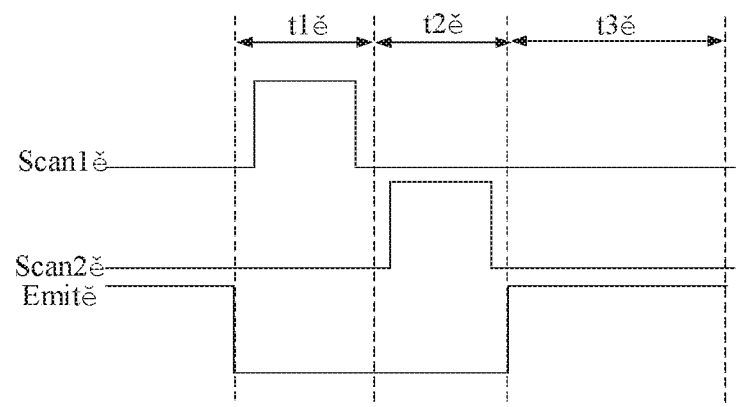
FIG. 2 is a sequence diagram corresponding to FIG. 1.

An operation principle of the pixel driving circuit 2 is similar to an operation principle of the pixel driving circuit 2 shown in FIG. 1, and will not be repeated herein. By setting both the fourth transistor T4 and the fifth transistor T5 to be the transistor 5 of the first type, during the light-emitting phase, the fourth transistor T4 and the fifth transistor T5 are turned off. Since the fourth transistor T4 and the fifth transistor T5 have smaller leakage currents when in an off state, an influence of the leakage current on the potential of the first node N1 can be significantly alleviated. Such a configuration avoids a shift of the potential of the first node N1 and thus achieves the accuracy of the actual light-emitting brightness of the first organic light-emitting element D1. Moreover, since the fourth transistor T4 and the fifth transistor T5 have good stability, the stability of the overall pixel driving circuit 2 in the operation state is improved.

Figure 13:
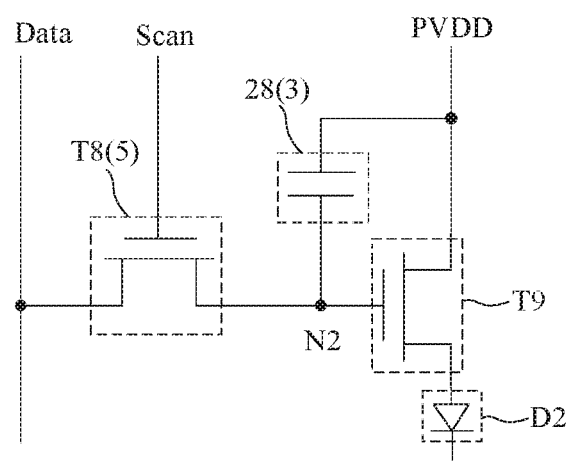
FIG. 13 is a schematic diagram of another structure of a pixel driving circuit according to an embodiment of the present disclosure.

FIG. 13 is a schematic diagram of another structure of a pixel driving circuit according to an embodiment of the present disclosure. With reference to FIG. 13, the pixel driving circuit 2 includes: a second storage capacitor 28 including a first electrode plate electrically connected to a power signal line PVDD, and a second electrode plate; an eighth transistor T8 being the transistor 5 of the first type and including a composite gate electrode 10 electrically connected to a scan signal line Scan, a composite source electrode 11 electrically connected to a data line Data, and a composite drain electrode 12 electrically connected to the second electrode plate of the second storage capacitor 28; and a ninth transistor T9 including a gate electrode electrically connected to the second electrode plate of the second storage capacitor 28, a source electrode electrically connected to the power signal line PVDD, and a drain electrode electrically connected to a second organic light-emitting element D2. By setting the eighth transistor T8 to be the transistor 5 of the first type, an influence of the leakage current of the eighth transistor T8 on the potential of the second node N2 can be alleviated, thereby achieving the accuracy of the potential of the second node N2 and effectively achieving the stability of the operation state of the ninth transistor T9. This can provide that a required driving current to the second organic light-emitting element D2, and since the stability of the eighth transistor T8 is good, the stability of the overall pixel driving circuit 2 in the operation state can be improved.

Figure 14:
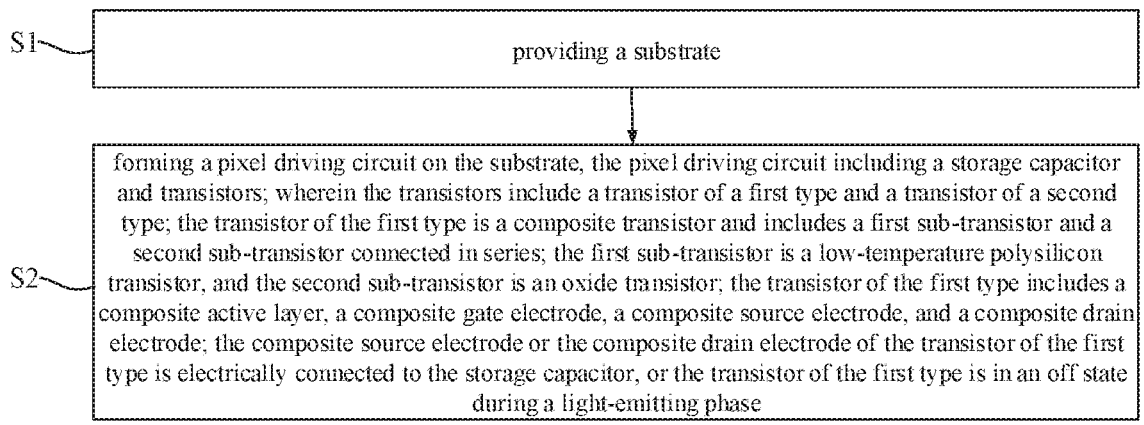
FIG. 14 is a flowchart of a manufacturing method according to an embodiment of the present disclosure.

An embodiment of the present disclosure further provides a method for manufacturing a display panel. FIG. 14 is a flowchart of a manufacturing method according to an embodiment of the present disclosure. With reference to FIG. 3 to FIG. 5, the method for manufacturing the display panel includes following steps.

At step S1, a substrate 1 is provided.

At step S2, a pixel driving circuit 2 is formed on the substrate 1. The pixel driving circuit 2 includes a storage capacitor 3 and transistors. The transistors include a transistor of a first type 5 and a transistor of a second type 6. The transistor 5 of the first type is a composite transistor. The transistor 5 of the first type includes a first sub-transistor 7 and a second sub-transistor 8 that are connected in series. The first sub-transistor 7 is a low-temperature polysilicon transistor, and the second sub-transistor 8 is an oxide transistor. The transistor 5 of the first type includes a composite active layer 9, a composite gate electrode 10, a composite source electrode 11 and a composite drain electrode 12. The composite source electrode 11 or the composite drain electrode 12 of the transistor 5 of the first type is electrically connected to the storage capacitor 3, or the transistor 5 of the first type is in an off state during a light-emitting phase.

With the manufacturing method provided by this embodiment of the present disclosure, the transistor 5 of the first type includes the low-temperature polysilicon transistor and the oxide transistor that are connected in series, thereby allowing the transistor 5 of the first type to have characteristics of a small leakage current and good stability in an off state, which can alleviate an influence of the leakage current on a potential stored in the storage capacitor 3, thereby improving stability of a voltage at a node in the pixel driving circuit 2. In this way, an accuracy of an actual light-emitting brightness of a light-emitting diode can be improved, and an operation stability itself can be improved, thereby improving stability of the overall pixel driving circuit 2 in an operation state.

Figure 15:
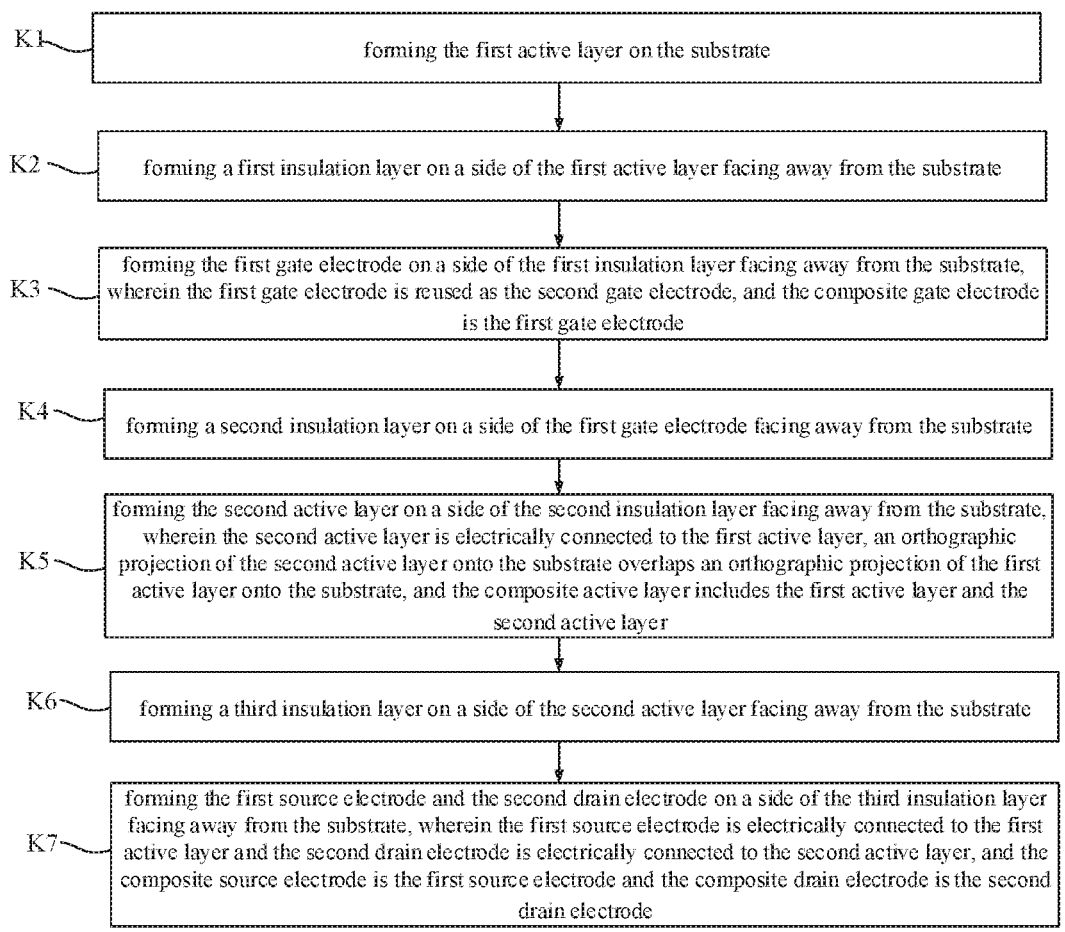
FIG. 15 is another flowchart of a manufacturing method according to an embodiment of the present disclosure.
Figure 16:
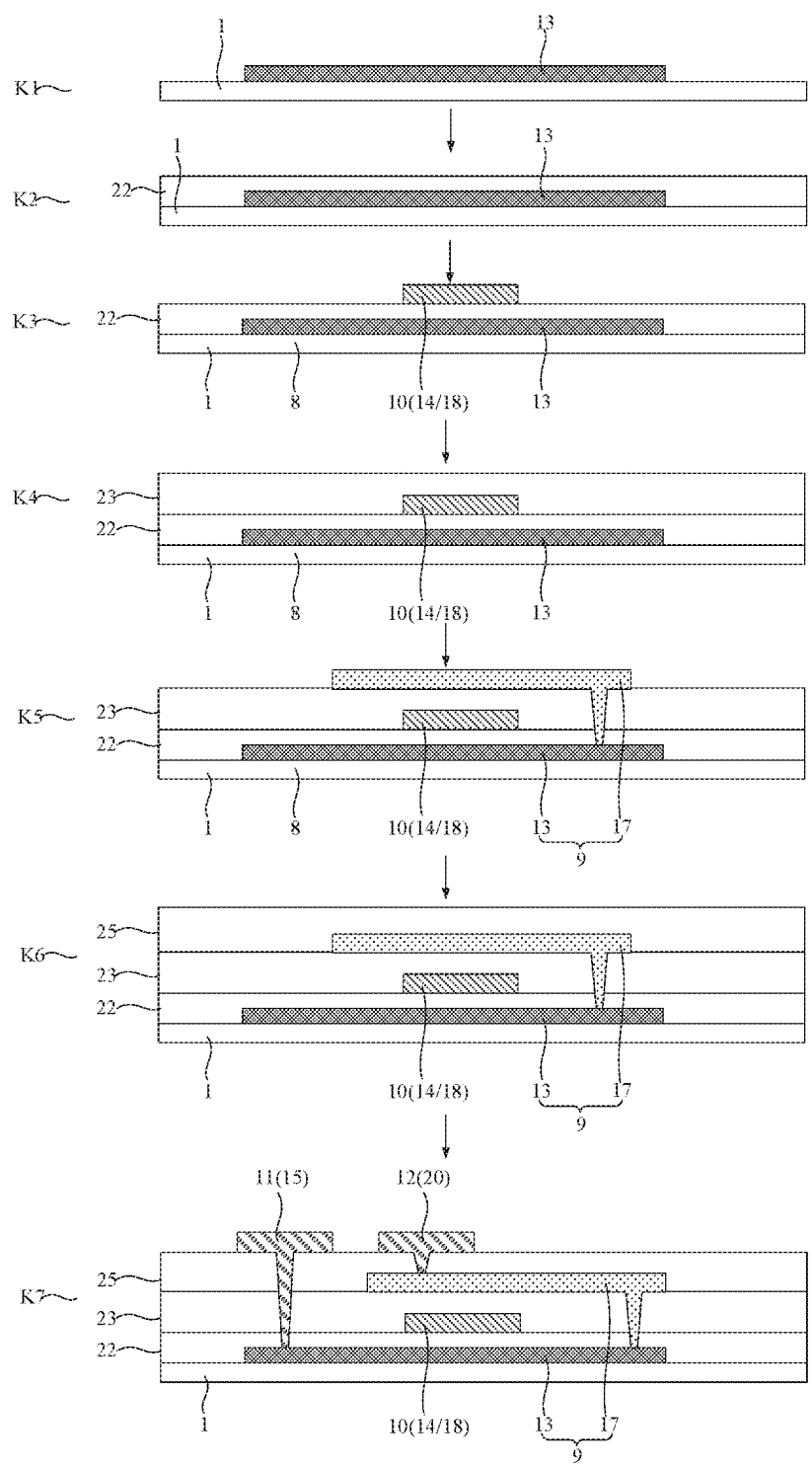
FIG. 16 is a schematic diagram of a structure corresponding to the manufacturing method of FIG. 15.

As an example, with reference to FIG. 5, the first sub-transistor 7 includes a first active layer 13, a first gate electrode 14 and a first source electrode 15, and the second sub-transistor 8 includes a second active layer 17, a second gate electrode 18 and a second drain electrode 20. FIG. 15 is another flowchart of a manufacturing method according to an embodiment of the present disclosure, and FIG. 16 is a schematic diagram of a structure corresponding to the manufacturing method of FIG. 15. With reference to FIG. 15 and FIG. 16, a process of forming the transistor 5 of the first type includes following steps.

At step K1, a first active layer 13 is formed on a substrate 1, and the first active layer 13 may be made of a low-temperature polysilicon material.

At step K2, a first insulation layer 22 is formed on a side of the first active layer 13 facing away from substrate 1.

At step K3, a first gate electrode 14 is formed on a side of the first insulation layer 22 facing away from the substrate 1. The first gate electrode 14 is reused as a second gate electrode 18. A composite gate electrode 10 is the first gate electrode 14. At this time, in a single transistor 5 of the first type, it is only needed to provide one gate as the composite gate electrode 10, which not only simplifies a manufacturing process, but also reduces a space occupied by the composite gate electrode 10.

At step K4, a second insulation layer 23 is formed on a side of the first gate electrode 14 facing away from substrate 1.

At step K5, a second active layer 17 is formed on a side of the second insulation layer 23 facing away from substrate 1. The second active layer 17 is electrically connected to the first active layer 13, and an orthographic projection of the second active layer 17 onto the substrate 1 overlaps an orthographic projection of the first active layer 13 onto the substrate 1. The composite active layer 9 includes the first active layer 13 and the second active layer 17.

The first active layer 13 overlapping the second active layer 17 in a direction perpendicular to a plane of the substrate 1 can reduce a space occupied by the first active layer 13 and the second active layer 17 in a direction parallel with the plane of the substrate 1, i.e., reducing a space occupied by the first sub-transistor. In this way, a space occupied by a single pixel driving circuit 2 can be reduced, thereby increasing pixel driving circuits 2 provided in a unit area and thus increasing a resolution of the display panel.

At step K6, a third insulation layer 25 is formed on a side of the second active layer 17 facing away from substrate 1.

At step K7, a first source electrode 15 and a second drain electrode 20 are formed on a side of the third insulation layer 25 facing away from substrate 1. The first source electrode 15 is electrically connected to the first active layer 13, and the second drain electrode 20 is electrically connected to the second active layer 17. A composite source electrode 11 is the first source electrode 15, and a composite drain electrode 12 is the second drain electrode 20.

Further, with reference to FIG. 8 and FIG. 9, the first source electrode 15 is electrically connected to the first active layer 13 through the auxiliary connection portion 24, and the auxiliary connection portion 24 and the first gate electrode 14 are arranged in a common layer, or the auxiliary connection portion 24 and the second active layer 17 are arranged in a same layer. With reference to the description of the process flow of the first active layer 13, the first gate electrode 14, the first auxiliary connection portion 21, the second active layer 17, and the first source electrode 15 in the embodiment described above, by providing the auxiliary connection portion 24, after a hydrofluoric acid treatment is performed on a source-drain contact area of the first active layer 13, the second active layer 17 can be prevented from being corroded by the hydrofluoric acid. Moreover, the auxiliary connection portion 24 is arranged in the same layer as the first gate electrode 14 or the second active layer 17, so that the auxiliary connection portion 24 does not need to occupy additional layer space, which not only simplifies the process flow, but also facilitates thin and light design of the display panel.

Figure 17:
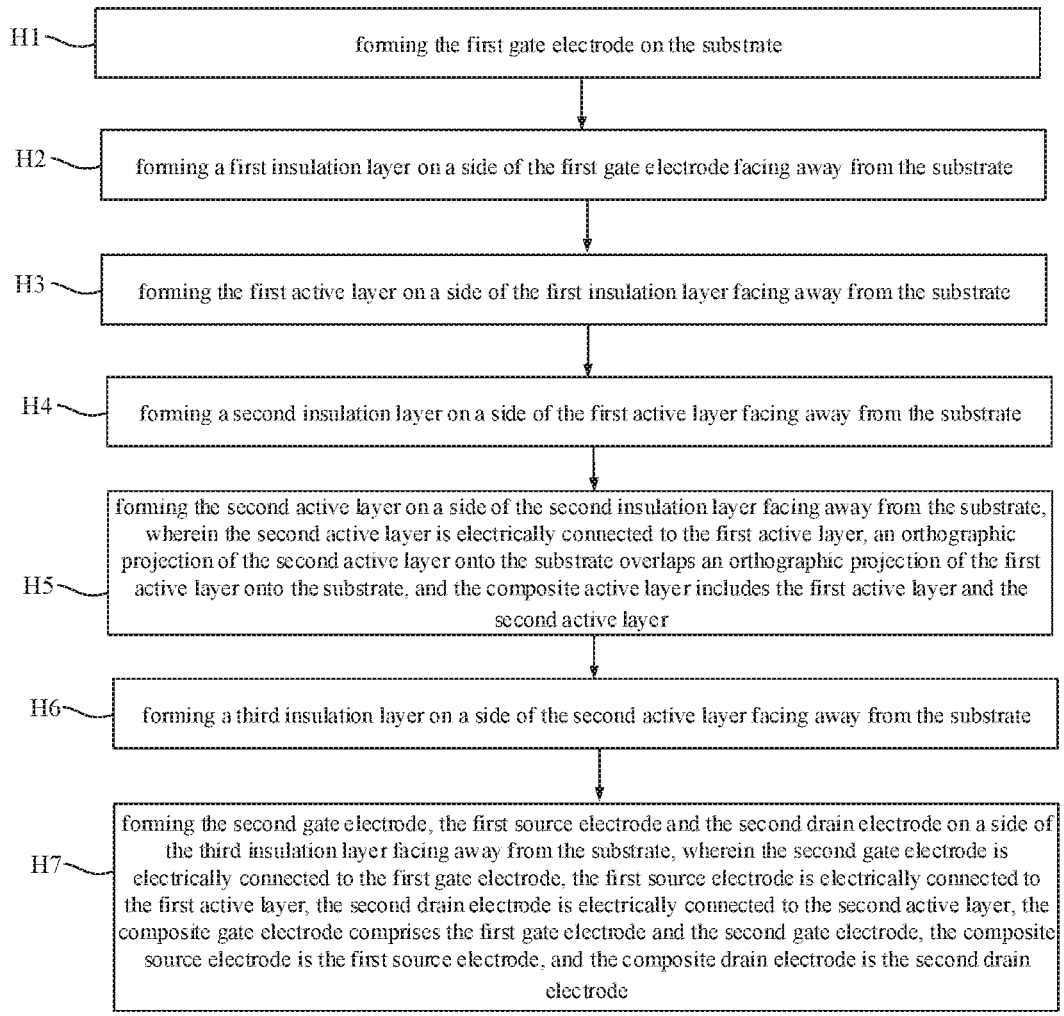
FIG. 17 is another flowchart of a manufacturing method according to an embodiment of the present disclosure.
Figure 18:
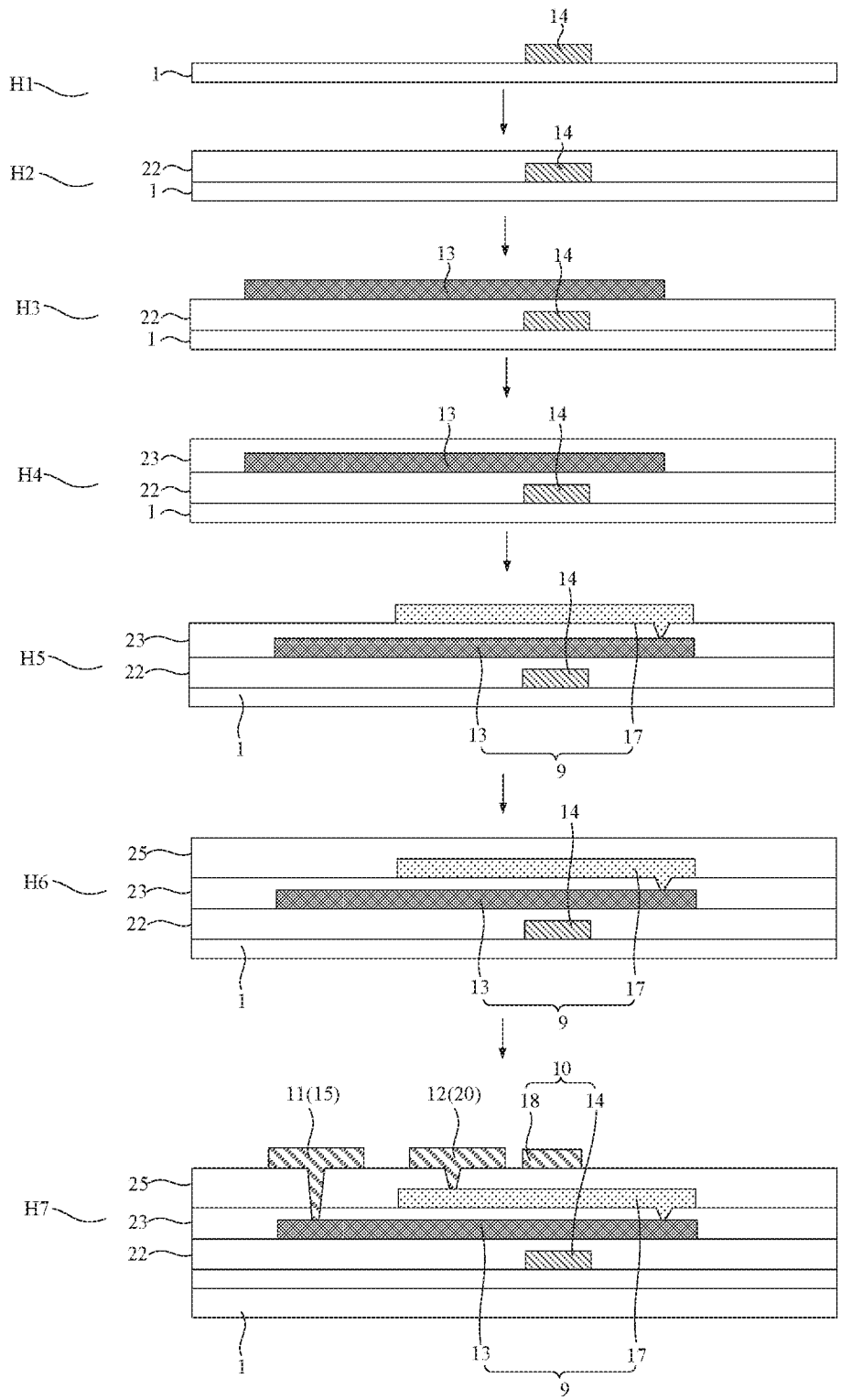
FIG. 18 is a schematic diagram of a structure corresponding to the manufacturing method of FIG. 17.

In an example, with reference to FIG. 10, the first sub-transistor 7 includes a first active layer 13, a first gate electrode 14 and a first source electrode 15, and the second sub-transistor 8 includes a second active layer 17, a second gate electrode 18 and a second drain electrode 20. FIG. 17 is another flowchart of a manufacturing method according to an embodiment of the present disclosure, and FIG. 18 is a schematic diagram of a structure corresponding to the manufacturing method of FIG. 17. With reference to FIG. 17 and FIG. 18, a process of forming the transistor 5 of the first type includes following steps.

At step H1, a first gate electrode 14 is formed on a substrate 1.

At step H2, a first insulation layer 22 is formed on a side of the first gate electrode 14 facing away from the substrate 1.

At step H3, a first active layer 13 is formed on a side of the first insulation layer 22 facing away from substrate 1.

At step H4, a second insulation layer 23 is formed on a side of the first active layer 13 facing away from substrate 1.

At step H5, a second active layer 17 is formed on a side of the second insulation layer 23 facing away from the substrate 1. The second active layer 17 is electrically connected to the first active layer 13, and an orthographic projection of the second active layer 17 onto the substrate 1 overlaps an orthographic projection of the first active layer 13 onto the substrate 1. The composite active layer 9 includes the first active layer 13 and the second active layer 17.

The first active layer 13 overlapping the second active layer 17 in a direction perpendicular to a plane of the substrate 1 can reduce a space occupied by the first active layer 13 and the second active layer 17 in a direction parallel with the plane of the substrate 1, i.e., reducing a space occupied by the first sub-transistor. In this way, a space occupied by a single pixel driving circuit 2 can be reduced, thereby increasing a number of pixel driving circuits 2 provided in a unit area and thus increasing a resolution of the display panel.

At step H6, a third insulation layer 25 is formed on a side of the second active layer 17 facing away from the substrate 1.

At step H7, a second gate electrode 18, a first source electrode 15, and a second drain electrode 20 are formed on a side of the third insulation layer 25 facing away from the substrate 1. The second gate electrode 18 is electrically connected to the first gate electrode 14, the source electrode 15 is electrically connected to the first active layer 13, and the second drain electrode 20 is electrically connected to the second active layer 17. The composite gate electrode 10 includes the first gate electrode 14 and the second gate electrode 18. A composite source electrode 11 is the first source electrode 15, and a composite drain electrode 12 is the second drain electrode 20.

When the composite gate electrode 10 includes the first gate electrode 14 and the second gate electrode 18, the first gate electrode 14 is located on a side of the first active layer 13 facing towards the substrate 1, so that a thickness of an insulation layer between the first active layer 13 and the second active layer 17 can be reduced, thereby improving connection stability between the first active layer 13 and the second active layer 17. Moreover, the second gate electrode 18 is arranged in the same layer as the composite source electrode 11 and the composite drain electrode 12, so that the second gate electrode 18 does not need to occupy additional layer space and thus will not cause an increase in the thickness of the display panel.

In order to further improve the operation stability of the pixel driving circuit 2, the transistor 6 of the second type can be set as a low-temperature polysilicon transistor with better stability.

Figure 19:
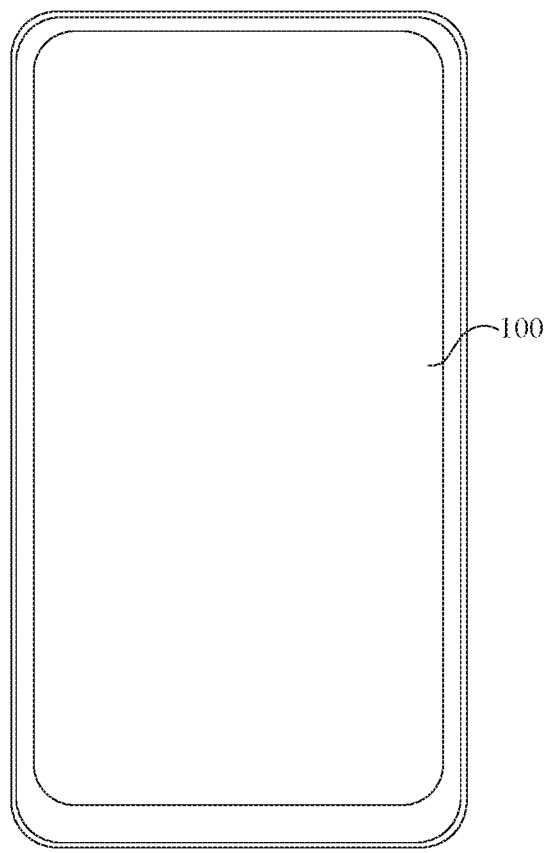
FIG. 19 is a schematic diagram of a structure of a display device according to an embodiment of the present disclosure.

An embodiment of the present disclosure further provides a display device. FIG. 19 is a schematic diagram of a structure of a display device according to an embodiment of the present disclosure. With reference to FIG. 19, the display device includes the display panel 100 described above. A structure of the display panel 100 has been described in details in the above embodiments, and will not be repeated herein. It should be noted that the display device shown in FIG. 19 is merely schematic, and the display device can be any electronic device including a display function such as a mobile phone, a tablet computer, a notebook computer, an electronic paper book, or a television.

The display device provided by this embodiment of the present disclosure includes the display panel 100 described above. Therefore, with this display device, an influence of the leakage current on a potential stored in the storage capacitor 3 can be alleviated, thereby improving stability of a voltage at a node in the pixel driving circuit 2. In this way, an accuracy of an actual light-emitting brightness of a light-emitting diode can be improved, and an operation stability itself can be improved, thereby improving stability of the overall pixel driving circuit 2 in an operation state and thus improving the display performance.

The above-described embodiments are merely preferred embodiments of the present disclosure and are not intended to limit the present disclosure. Any modifications, equivalent substitutions and improvements made within the principle of the present disclosure shall fall into the protection scope of the present disclosure.

Finally, it should be noted that, the above-described embodiments are merely for illustrating the present disclosure but not intended to provide any limitation. Although the present disclosure has been described in detail with reference to the above-described embodiments, it should be understood by those skilled in the art that, it is still possible to modify the technical solutions described in the above embodiments or to equivalently replace some or all of the technical features therein, but these modifications or replacements do not cause the essence of corresponding technical solutions to depart from the scope of the present disclosure.

What is claimed is:

1. A display panel, comprising:
a substrate; and
a plurality of pixel driving circuits disposed on the substrate, the plurality of pixel driving circuits comprising a storage capacitor and transistors;
wherein the transistors comprise at least one transistor of a first type and at least one transistor of a second type;
wherein each of the at least one transistor of the first type is a composite transistor and comprises a first sub-transistor and a second sub-transistor that are connected in series; wherein the first sub-transistor is a low-temperature polysilicon transistor, and the second sub-transistor is an oxide transistor; wherein each of the at least one transistor of the first type comprises a composite active layer, a composite gate electrode, a composite source electrode, and a composite drain electrode; wherein the composite source electrode or the composite drain electrode of each of the at least one transistor of the first type is electrically connected to the storage capacitor, or each of the at least one transistor of the first type is in an off state during a light-emitting phase,
wherein the first sub-transistor comprises a first active layer, a first gate electrode and a first source electrode, and the first source electrode is electrically connected to the first active layer; the second sub-transistor comprises a second active layer, a second gate electrode and a second drain electrode, wherein the second drain electrode is electrically connected to the second active layer, and the first active layer is electrically and directly connected to the second active layer, and
wherein the composite active layer comprises the first active layer and the second active layer, the composite source electrode is the first source electrode, and the composite drain electrode is the second drain electrode.

2. The display panel according to claim 1, wherein the second active layer is located on a side of the first active layer facing away from the substrate, and the second active layer overlaps the first active layer in a direction perpendicular to a plane of the substrate.

3. The display panel according to claim 2, wherein the first gate electrode is reused as the second gate electrode, and the composite gate electrode is the first gate electrode.

4. The display panel according to claim 3, wherein the first gate electrode is located on a side of the first active layer facing towards the substrate.

5. The display panel according to claim 3, wherein the first gate electrode is located between the first active layer and the second active layer, and the first source electrode is located on a side of the second active layer facing away from the substrate; and
   wherein the first source electrode is electrically connected to the first active layer through an auxiliary connection portion; and the auxiliary connection portion and the first gate electrode are arranged in a same layer, or the auxiliary connection portion and the second active layer are arranged in a same layer.

6. The display panel according to claim 2, wherein the composite gate electrode comprises the first gate electrode and the second gate electrode; and
   wherein the first gate electrode is electrically connected to the second gate electrode, the first gate electrode is located on a side of the first active layer facing towards the substrate, and the second gate electrode, the composite source electrode, and the composite drain electrode are arranged in a same layer.

7. The display panel according to claim 6, wherein the composite gate electrode further comprises a third gate electrode located between the first active layer and the second active layer, and the third gate electrode is respectively electrically connected to the first gate electrode and the second gate electrode.

8. The display panel according to claim 6, wherein the first gate electrode overlaps the second gate electrode in a direction perpendicular to the plane of the substrate.

9. The display panel according to claim 1, wherein the at least one transistor of the second type is a low-temperature polysilicon transistor.

10. The display panel according to claim 1, wherein each of the plurality of pixel driving circuits comprises:
    a first storage capacitor comprising a first electrode plate electrically connected to a power signal line, and a second electrode plate;
    a first transistor comprising a gate electrode electrically connected to a light-emitting control signal line, a source electrode electrically connected to the power signal line, and a drain electrode;
    a second transistor comprising a gate electrode electrically connected to a second scan signal line, a source electrode electrically connected to a data line, and a drain electrode electrically connected to the drain electrode of the first transistor;
    a third transistor comprising a gate electrode electrically connected to the second electrode plate of the first storage capacitor, a source electrode electrically connected to the drain electrode of the second transistor, and a drain electrode;
    a fourth transistor being one of the at least one transistor of the first type and comprising a composite gate electrode electrically connected to the second scan signal line, a composite source electrode electrically connected to the second electrode plate of the first storage capacitor, and a composite drain electrode electrically connected to the drain electrode of the third transistor;
    a fifth transistor being one of the at least one transistor of the first type and comprising a composite gate electrode electrically connected to a first scan signal line, a composite source electrode electrically connected to a reference signal line, and a composite drain electrode electrically connected to the second electrode plate of the first storage capacitor;
    a sixth transistor comprising a gate electrode electrically connected to the light-emitting control signal line, a source electrode electrically connected to the composite drain electrode of the fourth transistor, and a drain electrode electrically connected to an anode of a first organic light-emitting element; and
    a seventh transistor comprising a gate electrode electrically connected to the first scan signal line, a source electrode electrically connected to the reference signal line, and a drain electrode electrically connected to the anode of the first organic light-emitting element.

11. The display panel according to claim 1, wherein each of the plurality of pixel driving circuits comprises:
    a second storage capacitor comprising a first electrode plate electrically connected to a power signal line, and a second electrode plate;
    an eighth transistor being one of the at least one transistor of the first type and comprising a composite gate electrode electrically connected to a scan signal line, a composite source electrode electrically connected to a data line, and a composite drain electrode electrically connected to the second electrode plate of the second storage capacitor; and
    a ninth transistor comprising a gate electrode electrically connected to the second electrode plate of the second storage capacitor, a source electrode electrically connected to the power signal line, and a drain electrode electrically connected to a second organic light-emitting element.

12. A display device, comprising the display panel according to claim 1.

13. A method for manufacturing a display panel, comprising:
    providing a substrate; and
    forming a pixel driving circuit on the substrate, the pixel driving circuit comprising a storage capacitor and transistors;
    wherein the transistors at least one transistor of a first type and at least one transistor of a second type; wherein each of the at least one transistor of the first type is a composite transistor and comprises a first sub-transistor and a second sub-transistor that are connected in series; wherein the first sub-transistor is a low-temperature polysilicon transistor, and the second sub-transistor is an oxide transistor; wherein each of the at least one transistor of the first type comprises a composite active layer, a composite gate electrode, a composite source electrode, and a composite drain electrode; wherein the composite source electrode or the composite drain electrode of each of the at least one transistor of the first type is electrically connected to the storage capacitor, or each of the at least one transistor of the first type is in an off state during a light-emitting phase,
    wherein the first sub-transistor comprises a first active layer, a first gate electrode and a first source electrode, and the second sub-transistor comprises a second active layer, a second gate electrode and a second drain electrode, and wherein forming of each of the at least one transistor of the first type comprises:
  forming the first active layer on the substrate;
  forming a first insulation layer on a side of the first active layer facing away from the substrate;
  forming the first gate electrode on a side of the first insulation layer facing away from the substrate, wherein the first gate electrode is reused as the second gate electrode, and the composite gate electrode is the first gate electrode;
  forming a second insulation layer on a side of the first gate electrode facing away from the substrate;
  forming the second active layer on a side of the second insulation layer facing away from the substrate, wherein the second active layer is electrically connected to the first active layer, an orthographic projection of the second active layer onto the substrate overlaps an orthographic projection of the first active layer onto the substrate, and the composite active layer comprises the first active layer and the second active layer;
  forming a third insulation layer on a side of the second active layer facing away from the substrate; and
  forming the first source electrode and the second drain electrode on a side of the third insulation layer facing away from the substrate, wherein the first source electrode is electrically connected to the first active layer and the second drain electrode is electrically connected to the second active layer, and the composite source electrode is the first source electrode and the composite drain electrode is the second drain electrode.

14. The method according to claim 13, wherein
the first source electrode is electrically connected to the first active layer through an auxiliary connection portion; and the auxiliary connection portion and the first gate electrode are arranged in a common layer, or the auxiliary connection portion and the second active layer are arranged in a same layer.

15. The method according to claim 13, wherein each of the at least one transistor of the second type is the low-temperature polysilicon transistor.

16. A display panel, comprising:
a substrate; and
a plurality of pixel driving circuits disposed on the substrate, the plurality of pixel driving circuits comprising a storage capacitor and transistors;
wherein the transistors comprise at least one transistor of a first type and at least one transistor of a second type; wherein each of the at least one transistor of the first type is a composite transistor and comprises a first sub-transistor and a second sub-transistor that are connected in series; wherein the first sub-transistor is a low-temperature polysilicon transistor, and the second sub-transistor is an oxide transistor; wherein each of the at least one transistor of the first type comprises a composite active layer, a composite gate electrode, a composite source electrode, and a composite drain electrode; wherein the composite source electrode or the composite drain electrode of each of the at least one transistor of the first type is electrically connected to the storage capacitor, or each of the at least one transistor of the first type is in an off state during a light-emitting phase, and wherein each of the plurality of pixel driving circuits comprises:
  a first storage capacitor comprising a first electrode plate electrically connected to a power signal line, and a second electrode plate;
  a first transistor comprising a gate electrode electrically connected to a light-emitting control signal line, a source electrode electrically connected to the power signal line, and a drain electrode;
  a second transistor comprising a gate electrode electrically connected to a second scan signal line, a source electrode electrically connected to a data line, and a drain electrode electrically connected to the drain electrode of the first transistor;
  a third transistor comprising a gate electrode electrically connected to the second electrode plate of the first storage capacitor, a source electrode electrically connected to the drain electrode of the second transistor, and a drain electrode;
  a fourth transistor being one of the at least one transistor of the first type and comprising a composite gate electrode electrically connected to the second scan signal line, a composite source electrode electrically connected to the second electrode plate of the first storage capacitor, and a composite drain electrode electrically connected to the drain electrode of the third transistor;
  a fifth transistor being one of the at least one transistor of the first type and comprising a composite gate electrode electrically connected to a first scan signal line, a composite source electrode electrically connected to a reference signal line, and a composite drain electrode electrically connected to the second electrode plate of the first storage capacitor;
  a sixth transistor comprising a gate electrode electrically connected to the light-emitting control signal line, a source electrode electrically connected to the composite drain electrode of the fourth transistor, and a drain electrode electrically connected to an anode of a first organic light-emitting element; and
  a seventh transistor comprising a gate electrode electrically connected to the first scan signal line, a source electrode electrically connected to the reference signal line, and a drain electrode electrically connected to the anode of the first organic light-emitting element.

17. A display panel, comprising:
a substrate; and
a plurality of pixel driving circuits disposed on the substrate, the plurality of pixel driving circuits comprising a storage capacitor and transistors;
wherein the transistors comprise at least one transistor of a first type and at least one transistor of a second type; wherein each of the at least one transistor of the first type is a composite transistor and comprises a first sub-transistor and a second sub-transistor that are connected in series; wherein the first sub-transistor is a low-temperature polysilicon transistor, and the second sub-transistor is an oxide transistor; wherein each of the at least one transistor of the first type comprises a composite active layer, a composite gate electrode, a composite source electrode, and a composite drain electrode; wherein the composite source electrode or the composite drain electrode of each of the at least one transistor of the first type is electrically connected to the storage capacitor, or each of the at least one transistor of the first type is in an off state during a light-emitting phase, and wherein each of the plurality of pixel driving circuits comprises:
  a second storage capacitor comprising a first electrode plate electrically connected to a power signal line, and a second electrode plate;
  an eighth transistor being one of the at least one transistor of the first type and comprising a composite gate electrode electrically connected to a scan signal line, a composite source electrode electrically connected to a data line, and a composite drain electrode electrically connected to the second electrode plate of the second storage capacitor; and
  a ninth transistor comprising a gate electrode electrically connected to the second electrode plate of the second storage capacitor, a source electrode electrically connected to the power signal line, and a drain electrode electrically connected to a second organic light-emitting element.

18. A method for manufacturing a display panel, comprising:
  providing a substrate; and
  forming a pixel driving circuit on the substrate, the pixel driving circuit comprising a storage capacitor and transistors;
  wherein the transistors at least one transistor of a first type and at least one transistor of a second type; wherein each of the at least one transistor of the first type is a composite transistor and comprises a first sub-transistor and a second sub-transistor that are connected in series; wherein the first sub-transistor is a low-temperature polysilicon transistor, and the second sub-transistor is an oxide transistor; wherein each of the at least one transistor of the first type comprises a composite active layer, a composite gate electrode, a composite source electrode, and a composite drain electrode; wherein the composite source electrode or the composite drain electrode of each of the at least one transistor of the first type is electrically connected to the storage capacitor, or each of the at least one transistor of the first type is in an off state during a light-emitting phase, wherein the first sub-transistor comprises a first active layer, a first gate electrode and a first source electrode, and the second sub-transistor comprises a second active layer, a second gate electrode and a second drain electrode, and wherein forming of each of the at least one transistor of the first type comprises:
  forming the first gate electrode on the substrate;
  forming a first insulation layer on a side of the first gate electrode facing away from the substrate;
  forming the first active layer on a side of the first insulation layer facing away from the substrate;
  forming a second insulation layer on a side of the first active layer facing away from the substrate;
  forming the second active layer on a side of the second insulation layer facing away from the substrate, wherein the second active layer is electrically connected to the first active layer, an orthographic projection of the second active layer onto the substrate overlaps an orthographic projection of the first active layer onto the substrate, and the composite active layer comprises the first active layer and the second active layer;
  forming a third insulation layer on a side of the second active layer facing away from the substrate; and
  forming the second gate electrode, the first source electrode and the second drain electrode on a side of the third insulation layer facing away from the substrate, wherein the second gate electrode is electrically connected to the first gate electrode, the first source electrode is electrically connected to the first active layer, the second drain electrode is electrically connected to the second active layer, the composite gate electrode comprises the first gate electrode and the second gate electrode, the composite source electrode is the first source electrode, and the composite drain electrode is the second drain electrode.

* * * * *